United States Patent [19]

Huang

[11] 4,215,333

[45] Jul. 29, 1980

[54] RESISTOR TERMINATION

[75] Inventor: Jen-Yen Huang, San Jose, Calif.

[73] Assignee: National Semiconductor Corporation, Santa Clara, Calif.

[21] Appl. No.: 947,667

[22] Filed: Oct. 2, 1978

[51] Int. Cl.² ............................................. H01C 1/14
[52] U.S. Cl. .................................... 338/322; 338/324; 357/68
[58] Field of Search ............... 338/322, 324, 325, 327, 338/307–309; 29/610; 357/68, 51

[56] References Cited

U.S. PATENT DOCUMENTS

| 3,644,802 | 2/1972 | Dingwall | 357/51 |
| 3,714,709 | 2/1973 | Liederbach | 357/51 X |

*Primary Examiner*—C. L. Albritton
*Attorney, Agent, or Firm*—Gail W. Woodward; James A. Sheridan

[57] ABSTRACT

An elongated resistor is terminated in a plurality of resistance segments arranged in pairs that have mirror symmetry along a line that lies along the center line of the resistor. The pairs are coupled together and joined to metallization via contact means so that a reduced resistance contact is obtained and in which when the contact is misaligned, the resistor value is unchanged. The structure is useful in forming precision resistor ladders in integrated digital to analog converter circuits.

7 Claims, 7 Drawing Figures

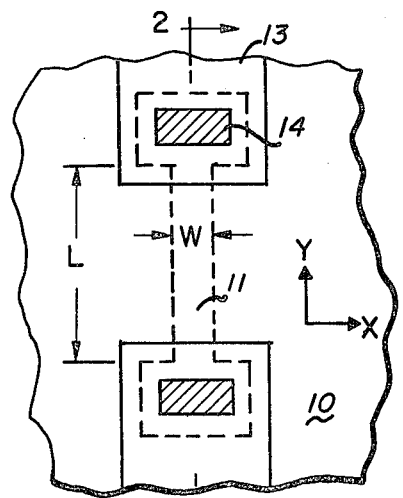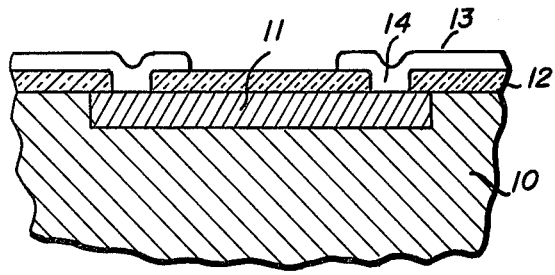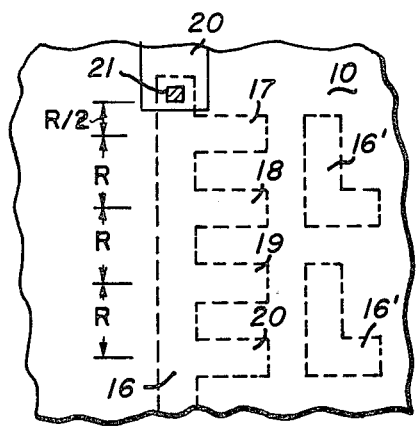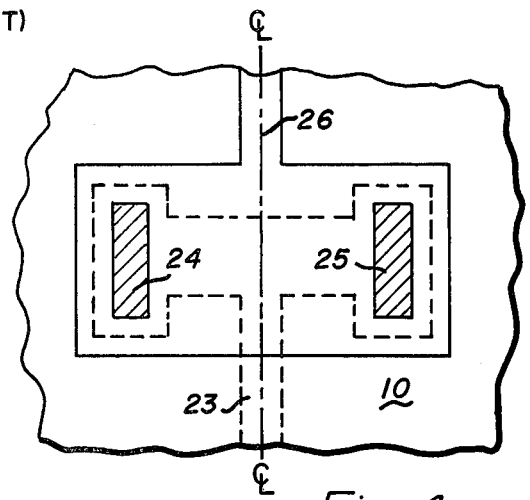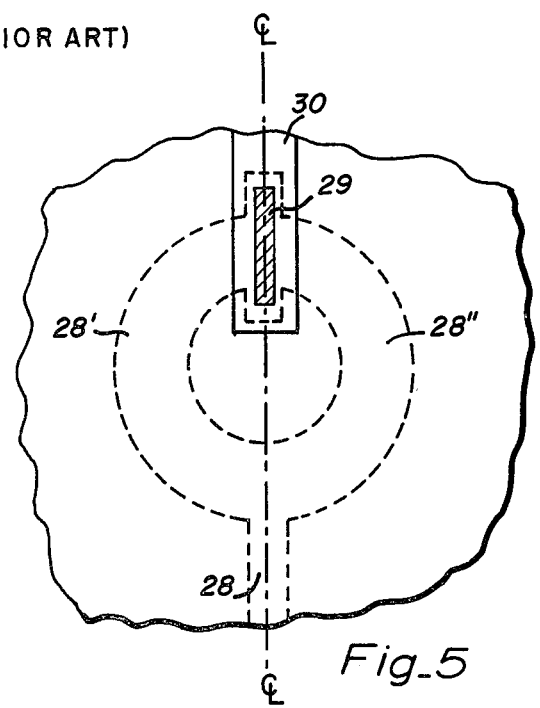
Fig_1 (PRIOR ART)
Fig_2 (PRIOR ART)
Fig_3 (PRIOR ART)
Fig_4
Fig_5

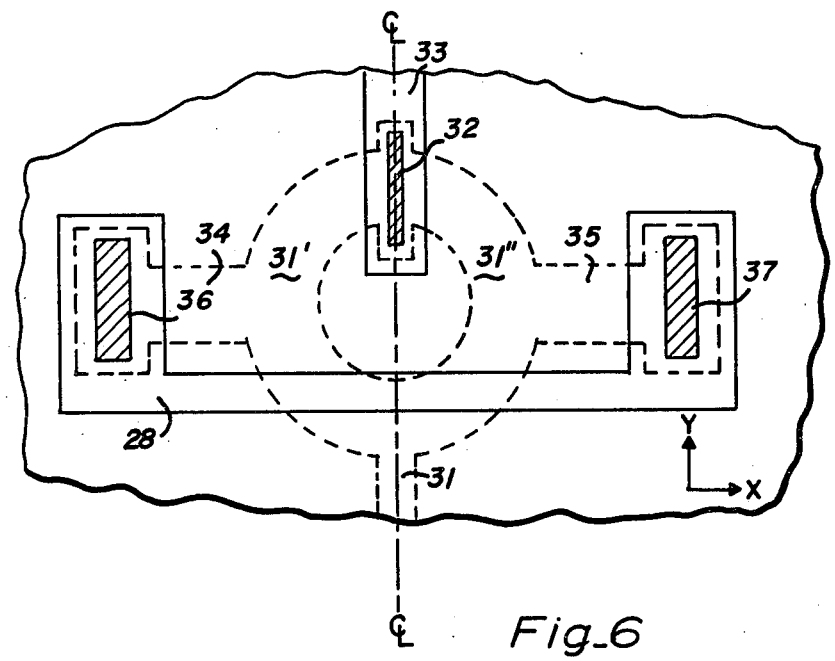
Fig_6
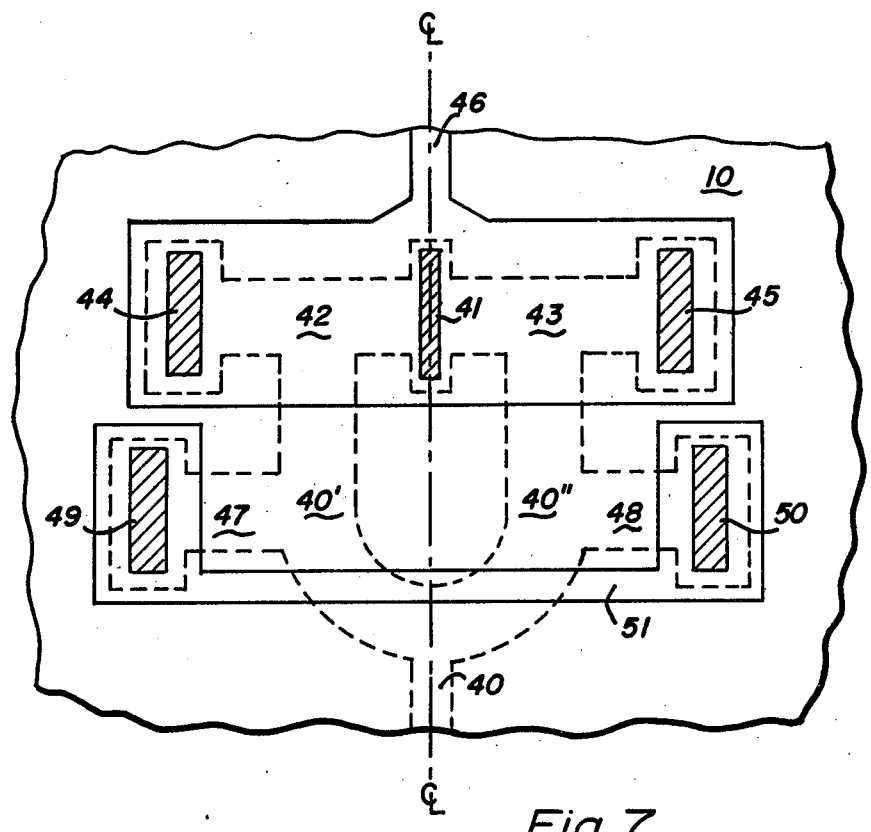
Fig_7

RESISTOR TERMINATION

BACKGROUND OF THE INVENTION

Monolithic semiconductor integrated circuit (IC) resistors are commonly created by diffusing an impurity into a semiconductor substrate to create a controlled region of a conductivity type opposite to that of the substrate. The resistor value is determined by the resistor shape and size, which are geometric factors, and by the depth of diffusion and impurity concentration, which are process factors. Typically, the resistor is contacted by etching holes in the oxide layer on the semiconductor substrate at points adjacent to the resistor ends. Then when metallization is applied to the semiconductor, it will be in ohmic contact with the resistor ends thus providing the required connections. Since the metallization connection is via an aperture in the oxide, the aperture location will also influence the value of the resistor. For example, the size of the aperture and the spacing between end apertures both will have an effect on resistance. These aperture factors are geometric and are normally well enough controlled to be regarded as secondary tolerance factors.

Conventional IC devices usually do not require precisely controlled resistor values but often require precise resistor ratios. In particular, matched resistors are often employed. In this case, the resistors to be matched are located side by side and created so that whatever geometric factors apply to one, apply to the other. Since the two resistors are manufactured simultaneously, manufacturing variables will apply equally to both resistors. Thus, resistor matching (and ratioing)to a high degree of precision is available in the IC fabrication art. However, the absolute resistor value cannot be reproduced to high tolerance.

Typically, resistors are simply elongated diffused regions of semiconductor. In order to reduce sensitivity to contact variables, the resistor end is enlarged and a relatively large area metallization employed. This means that the resistors body proper largely determines resistance, and contact variables are second order effects.

The IC fabrication art has developed to where relatively narrow high value resistors can be created using diffusion to a tolerance of about ±15%. However, resistors can be matched to within about 2% and ratioed to about 5% (for 5:1 ratio).

While IC devices can be mass produced in circuits that do not require precision resistors, many applications require much more stringent tolerances. For example, in an 8-bit digital to analog (D/A) converter one IC approach is to employ a resistor ladder having 256 resistor elements. The ladder is usually formed from an elongated diffused region that is provided with side extensions that form taps thereon. The resistor and tap portions are formed simultaneously in a single diffusion operation so that the taps are accurately located. Therefore, regardless of process variables, the separate resistors will all be of the same value even though the actual value could vary substantially. However, the resistor elements at each end of the ladder must be contacted and their values are subject to the various processing variables. In conventional D/A converters, the resistor at one end of the ladder is made equal to one half of the value of the ladder resistors. The resistor at the other end of the ladder is made to have 1.5 times the resistor value. This is done to shift the ladder taps by one half bit to minimize conversion errors. In any event, it can be seen that while the 254 resistors in the body can be precisely matched, the two end resistors are subjected to the conventional resistor tolerances of IC manufacturing. In D/A converters, this is not ordinarily good enough. Accordingly, in precision D/A converters some sort of trimming is commonly employed. One way to do this is to fabricate the resistor to be trimmed as a deposited film on top of the oxide on the IC. Then after the circuit fabrication is completed, the film resistor can be precision trimmed with a laser or other removal means to a precise value.

The trimming approach is undesirable from several standpoints. It is costly because it requires extra equipment and processing. Since the end resistors are not the same as the rest of the resistors, they behave differently. Also it has been found that after trimming, many film resistors tend to drift in value. Clearly it would be desirable to incorporate the end resistors into the ladder and to make contact to them in a reproducable manner.

SUMMARY OF THE INVENTION

It is an object of the invention to provide a resistor that is insensitive to contact alignment errors.

It is another object of the invention to provide a resistor contact having reduced resistance.

It is a further object of the invention to fabricate a resistor ladder in which the end resistor values are not subject to contact misalignment.

These and other objects are achieved by special contact means located at the end of the resistor that is to be connected to metallization. The resistor body is enlarged and split into two separate resistor ends using a shape that has mirror symmetry about a center line that extends along the axis of the resistor body. The two resistor ends are arrayed to extend perpendicular to the resistor axis in the contact region. The metallization is applied to the two separate ends so that they are effectively connected in parallel. Since the ends are perpendicular to the body, any contact misalignment will react oppositely on the parallel resistance values. In addition, the parallel connection acts to reduce contact resistance which reduces the resistance dependence on the size of the contact. Thus, the sensitivity of contact resistance to manufacturing variables is greatly reduced.

BRIEF DESCRIPTION OF THE DRAWING

FIG. 1 shows a conventional prior art IC resistor construction;

FIG. 2 is a cross section of the structure of FIG. 1;

FIG. 3 shows a portion of a diffused prior art resistor ladder;

FIG. 4 shows a resistor end contact using a structure in accordance with the invention;

FIG. 5 shows an alternative construction of a resistor end contact;

FIG. 6 shows a resistor end contact that is substantially insensitive to contact misalignment errors; and FIG. 7 shows a further combination of elements forming a resistor end contact.

DESCRIPTION OF THE PRIOR ART

FIG. 1 shows a typical prior art diffused resistor structure. Semiconductor substrate 10 contains a diffused region 11 shown in dashed outline. The form is sometimes referred as a dogbone. FIG. 2 shows a fragmentary cross section of the resistor of FIG. 1 taken along the resistor centerline. Diffusion 11 lies under an oxide layer 12 that covers the surface of the semiconductor. Metallization 13 makes contact with diffused region 11 at 14 via a contact cut extending through the oxide. It will be noted that the contact cuts are wider than the resistor body and are located entirely within the enlarged end portion. This construction permits considerable positional variation in the location of the contact cut relative to the diffused region. This eases the alignment requirement in the manufacturing process. For example, if the contact cuts are displaced in the X direction, there will be no serious change in resistance until the contact cut no longer extends beyond the dimension W. If the contact cuts are displaced in the Y direction, any resistance increase at one end is matched by a similar resistance decrease at the other end. As a practical matter, the contact cut is made as large as possible to minimize the effects of variations in area.

The value of the resistor is:

$$R \approx R_s (L/W) \tag{1}$$

where: Rs is the resistance of the diffusion in ohms per square. Since the ends of the diffused region are enlarged, this formula is a good approximation.

In many cases, the enlarged end portion is omitted and dimension L measured between the contact cuts. This approach is often used for small resistor values where dimension W is large.

FIG. 3 shows a prior art resistor structure used in the fabrication of a resistance ladder of the kind employed in digital to analog converter circuits. Here, substrate 10 contains diffused regions 16 and 16'. Region 16 has a plurality of extensions 17–20 which, in effect, form taps on the resistor. Extensions 17–20 in practice form switch device electrodes. A switching tree, well-known in the art, is formed adjacent to the resistor and operated so that the resistor taps can be selectively coupled to a single output terminal (not shown). Regions 16' form other switching device electrodes which are part of the tree.

Metallization 20 is connected to diffused region 16 by way of contact cut 21. In the structure shown, the equidistant taps 17–20 form equal value series connected resistors R. Between the last tap 17 and contact cut 21, a value of R/2 is employed as is employed in the D/A converter art. It is to be noted that, if desired, the end resistor could be made equal to 3R/2 by simply not employing the last resistor tap. A typical commercial structure may employ 256 resistors of the kind shown in an 8-bit D/A converter.

It can be seen that the diffusion geometry controls the R values and this can be held to a high precision in conventional integrated circuit processing. Even though the absolute value of the resistors may not be precisely controlled, the relative locations of the taps on the resistor can be controlled and this is the important factor in D/A converters.

While the R values can be precisely controlled, it can be seen that the contact cut 21 must be precisely located with respect to tap 17 and controlled in size. For an 8-bit D/A converter, this value must be very precise. In some cases, a trimmable resistor is associated with metallization 20, and the resistance value precisely trimmmed as part of the manufacturing process. However, this adds complexity and cost to the product.

DESCRIPTION OF THE INVENTION

FIG. 4 shows a contact structure that can be employed in a tapped resistor structure and which is insensitive to contact cut location. Diffused region 23 in substrate 10 constitutes the end resistor in a resistor ladder. The diffused region is expanded laterally so that a dogbone resistor is symmetrically arrayed about the resistor ladder centerline. Two contact cuts, 24 and 25, are located in the dogbone, and metallization 26 connects the contacts together so that the dogbone resistor halves are connected in parallel. It can be seen that lateral displacement of the contact cuts 24 and 25 about the centerline will cancel. Any displacement along the centerline will not have any effect as long as the end of the cut overlaps the width of the dogbone resistor. Thus, a precision end resistor element is available for a resistor ladder.

FIG. 5 shows an alternative embodiment of the invention. In this case, the structure of FIG. 4 is curved to create a circular dogbone resistor where the ends overlap to result in a single contact 29. Diffusion 28 forms the end resistor of the ladder as did diffusion 23 of FIG. 4. The diffusion splits into two legs 28' and 28'' which are shown as circular with the ends overlapping at contact 29 where metallization 30 connects to the diffused resistor structure. While a circular form is shown, any form would be suitable such as, square, rectangular, hexagonal, octagonal, and the like. The only requirement is that contact 29 should lie substantially along the resistor centerline. Desirably, the two halves 28' and 28'' are mirror images of each other as was the case for the FIG. 4 embodiment. However, in FIG. 5 only one contact cut is required. The actual resistance of legs 28' and 28'' are controlled to provide the desired resistance of the end ladder resistor.

FIGS. 4 and 5 illustrate resistor end contacts that have relatively large area and therefore have reduced contact resistance. The form is arranged so that contact misalignment will not seriously alter the contact resistance. These structures greatly reduce the sensitivity of the resistance to processing variables notably contact misalignment.

FIG. 6 shows a resistor contact structure that has low contact resistance and is theoretically capable of eliminating sensitivity to contact misalignment. Diffusion 31 has two arms 31' and 31'' folded into a single contact region 32 which connects to metallization 33. The diffusion has additional arms 34 and 35 symmetrically arrayed about the resistor centerline. These arms terminate in contacts 36 and 37 respectively and metallization 38 shorts 36 and 37 together. If contacts 32, 36, and 37 are misaligned in the x direction, leg 31'' will have lower resistance than leg 31' and more current will flow in leg 32''. This acts to tend to increase the potential at the juncture of legs 31'' and 35 above the potential at the juncture of legs 31' and 34. However, any difference in potential will cause current to flow in leg 35, contact 37, metal 38, contact 36 and leg 34 to thereby increase the current in leg 31'. Thus, the structure of FIG. 6 not only has the capability of reduced resistance, it can substantially eliminate sensitivity to contact misalignment.

FIG. 7 shows still another alternative embodiment in which the structure has still lower contact resistance and can eliminate sensitivity to contact misalignment. Diffusion 40 is split into two arms 40' and 40'' which are looped around to join together at contact 41 each are is expanded to form dogbone resistors 42 and 43. Contacts 44 and 45 contact resistors 42 and 43, respectively. Metallization 46 covers contacts 41, 44, and 45, thus connecting them together. Resistor extensions 47 and 48 also couple to legs 40' and 40". Contacts 49 and 50 terminate resistors 47 and 48 which are connected together by metallization 51. Clearly the structure of FIG. 7 will have even lower effective contact resistance than that of FIG. 6. Again the structure is symmetrical about the resistor centerline and the effect of compensation for lateral contact cut misalignment is essentially as described above.

The invention has been described and several embodiments disclosed. It is clear that other alternatives and equivalents that are within the spirit and intent of the invention will occur to a person skilled in the art upon reading the foregoing disclosure. For example, while a diffused region in a semiconductor substrate comprises the preferred resistor, it could be fabricated by ion implantation. Furthermore, the resistor could be in the form of a resistance material deposited upon an insulating substrate, wherein conductive end contacts are to be established. Fundamentally, the invention is applicable generally to the fabrication of precision resistor elements. Accordingly, it is intended that the scope of the invention be limited only by the following claims.

I claim:

1. An integrated circuit element comprising an elongated body of material having substantial electrical resistance and conductive end contacts for connecting said body to metallization associated with said integrated circuit, at least one of said end contacts comprising:
    an enlarged end portion of said body terminating an elongated portion thereof, said elongated portion being contoured to provide a preponderance of the resistance of said elongated body, said end portion being configured to create a first pair of resistance regions extending perpendicular to the centerline of said elongated portion and to have mirror symmetry about said centerline; and
    metal contact means connected to the ends of said first pair of resistance regions that extend away from said elongated portion, said metal contact means being extended to connect to said metallization.

2. The resistor element of claim 1 wherein said first pair of resistance regions have a width substantially greater than the width of said elongated portion.

3. The resistor element of claim 1 wherein said first pair of resistance regions are straight sections extending equidistantly on either side of said centerline and said metallization is extended to contact the extremities of said first pair resistance regions.

4. The resistor element of claim 1 wherein said first pair of resistance regions form a loop in which the extremities thereof converge to form a single end contact region for connection to said metallization.

5. The resistor element of claim 4 further including: a second pair of resistance regions extending perpendicular to said centerline and having mirror symmetry about said centerline, one end of each element in said pair being extended to form a respective leg of said loop; and
    metallization means connecting the other ends of said elements in said second pair together.

6. The resistor element of claim 5 wherein said loop further includes third and fourth pairs of resistance regions extending parallel to said second pair and extending outward from the two elements of said loop whereby the inward extensions of said third and fourth pairs coincide and said metallization is connected to said third and fourth pairs where they coincide and at their opposite ends.

7. A resistor element fabricated into a semiconductor substrate for incorporation into a monolithic integrated circuit having an insulating surface layer of oxide thereon, said resistor including an elongated body of one semiconductor conductivity type diffused into an opposite conductivity type substrate and ohmic end contacts coupled through contact holes established in said oxide layer to metallization associated with said circuit, at least one of said ohmic end contacts comprising:
    an enlarged diffused end portion terminating said elongated body and configured to create a pair of resistance regions extending away from and connected to said elongated body only as extensions thereof, said pair of resistance regions extending at least initially perpendicular to said elongated body and being shaped to have mirror symmetry about a centerline extending along said elongated body; and
    means for connecting the ends of said pair of resistance regions extending away from said body in parallel to said metallization, said means for connecting including contact means extending through said oxide layer whereby any misalignment of said contact means results in substantially equal and opposite changes in said pair of resistance regions so that said misalignment does not appreciably alter the value of said resistor.

* * * * *